US 6,551,879 B1

(12) United States Patent
Chang

(10) Patent No.: US 6,551,879 B1
(45) Date of Patent: Apr. 22, 2003

(54) METHOD FOR FORMING AN OXIDE LAYER ON A NITRIDE LAYER

(75) Inventor: Kent Kuohua Chang, Taipei (TW)

(73) Assignee: Macronix International Co., Inc., Hsinchu (TW)

( * ) Notice: Subject to any disclaimer, the term of this patent is extended or adjusted under 35 U.S.C. 154(b) by 0 days.

(21) Appl. No.: 10/101,931

(22) Filed: Mar. 21, 2002

(51) Int. Cl.$^7$ .......................................... H01L 21/8247
(52) U.S. Cl. ...................... 438/258; 438/763; 438/766; 438/981
(58) Field of Search ................. 438/258, 981, 438/763, 766

(56) References Cited

U.S. PATENT DOCUMENTS 6,103,576 A * 8/2000 Deustcher et al. .......... 438/261
6,184,093 B1 * 2/2001 Sung ........................... 438/275
6,248,630 B1 * 6/2001 Clementi et al. ............ 438/258
6,265,267 B1 * 7/2001 Huang ......................... 438/258

* cited by examiner

Primary Examiner—Richard Booth
(74) Attorney, Agent, or Firm—Finnegan, Henderson, Farabow, Garrett & Dunner, L.L.P.

(57) ABSTRACT

A method for forming a semiconductor device that includes defining a substrate to include a peripheral section and a core section, masking the peripheral section of the substrate, growing a first dielectric layer over the core section of the substrate, depositing a first polysilicon layer over the first dielectric layer for forming at least one gate structure, growing a first oxide layer over the first polysilicon layer, depositing a nitride layer over the first oxide layer, implanting oxygen ions into the nitride layer, unmasking the peripheral section of the substrate, and growing a second oxide layer over the nitride layer, wherein the growth rate of the second oxide layer is increased due to the implantation of oxygen ions in the nitride layer.

16 Claims, 1 Drawing Sheet

METHOD FOR FORMING AN OXIDE LAYER ON A NITRIDE LAYER

FIELD OF THE INVENTION

This invention relates in general to a semiconductor manufacturing process and, more particularly, to a manufacturing process for forming an oxide layer on a nitride layer.

BACKGROUND OF THE INVENTION

In a flash memory device, there are generally two types of transistors formed on the device substrate. The first transistor type is a flash memory cell for storing data. The flash memory device includes a memory array having a plurality of flash memory cells formed contiguous with one another. The memory array is sometimes referred to as the "core" of the flash memory device. A second transistor type is the conventional metal-oxide-silicon ("MOS") transistor used in various circuits, such as sense amplifiers and charge pumps, of the flash memory device. MOS transistors are generally located around the flash memory array, or on the "peripheral" of the device substrate.

A flash memory cell and a traditional MOS transistor differ structurally in that the flash memory cell includes an additional polysilicon gate, termed "floating gate," positioned between the device substrate and a second polysilicon gate. The second polysilicon gate is the "control gate" of the flash memory cell. The control gate of the flash memory cell is separated from the floating gate by an oxide-nitride-oxide ("ONO") layer. The ONO layer includes a first oxide layer grown through a high temperature process over the floating gate. A nitride layer is then deposited over the first oxide layer, and a second oxide layer is grown over the nitride layer. For the MOS transistor, there does not include a floating gate and the "second polysilicon gate" is the traditional gate structure. Even though the MOS transistors and flash memory cells are different structurally, they are formed near contemporaneously in the manufacturing process of the flash memory device.

During the manufacturing process, the thickness of the top layer of the ONO layer, i.e., the second oxide layer, is difficult to control as a portion of the second oxide layer may be unintentionally etched away by certain chemical solutions used in the subsequent manufacturing steps, such as during the definition of the core area and etching of the periphery area, each of which uses a hydrogen-fluoride (HF) solution. It is known that oxide layers are susceptible to etching by the HF solution. One prior art manufacturing process attempts to address this problem by growing a thicker second oxide layer during its formation to account for the anticipated layer loss in the subsequent manufacturing steps. However, it is known in the art that growing an oxide layer on a nitride layer is difficult and time-consuming. The prior art manufacturing process, therefore, expends additional time, energy, and resources to increase the thickness of the second oxide layer. In addition, if the second oxide layer is not etched in the manner or at a rate as anticipated during the subsequent manufacturing step, the ONO layer would have a larger-than-expected thickness. As a result, certain portions of the ONO layer may not be completely removed as required by the design specification during the formation of the control gate, creating an ONO "fence" that impedes the subsequent manufacturing steps.

SUMMARY OF THE INVENTION

In accordance with the invention, there is provided a method for forming a semiconductor device that includes defining a substrate to include a peripheral section and a core section, masking the peripheral section of the substrate, growing a first dielectric layer over the core section of the substrate, depositing a first polysilicon layer over the first dielectric layer for forming at least one gate structure, growing a first oxide layer over the first polysilicon layer, depositing a nitride layer over the first oxide layer, implanting oxygen ions into the nitride layer, unmasking the peripheral section of the substrate, and growing a second oxide layer over the nitride layer, wherein the growth rate of the second oxide layer is increased due to the implantation of oxygen ions in the nitride layer.

In one aspect, the method also includes a step of cleaning the nitride layer after the step of oxygen ion implantation.

In another aspect, the method further includes a step of growing a gate oxide in the peripheral section of the substrate contemporaneously with the step of growing a second oxide layer.

Also in accordance with the present invention, there is provided a method for forming a semiconductor device that includes defining a substrate, growing a first dielectric layer over the core section of the substrate, depositing a first polysilicon layer over the first dielectric layer for forming at least one gate structure, growing a first oxide layer over the first polysilicon layer, depositing a nitride layer over the first oxide layer, implanting oxygen ions into the nitride layer, and growing a second oxide layer over the nitride layer, wherein the growth rate of the second oxide layer is increased due to the implantation of oxygen ions in the nitride layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiments of the invention and together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1:
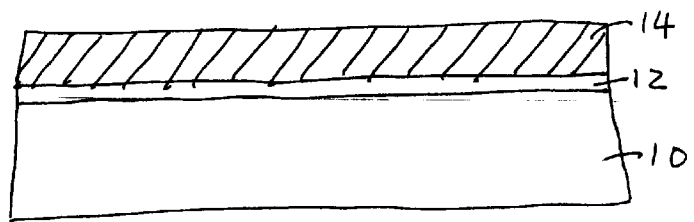
FIGS. 1–3 are cross-sectional views of the manufacturing process steps consistent with the present invention.
Figure 2:
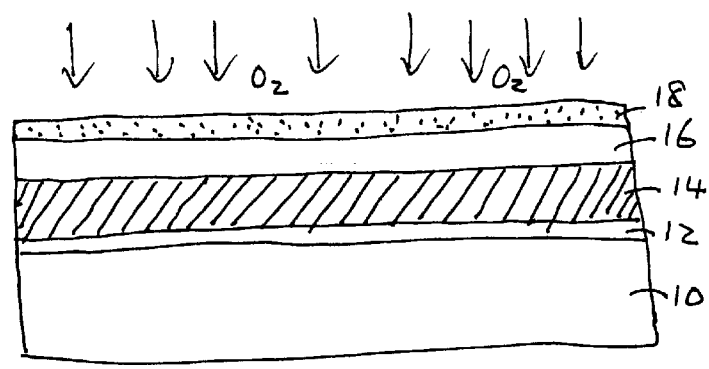
Figure 3:
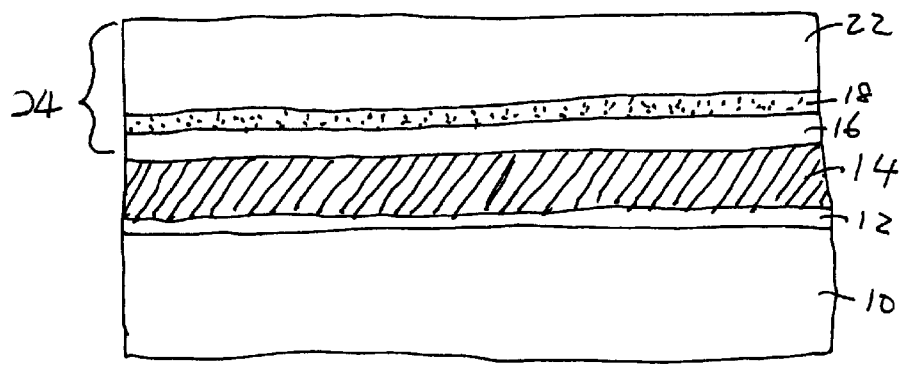

FIGS. 1–3 are cross-sectional views of the manufacturing process steps consistent with the present invention. Referring to FIG. 1, a substrate 10 is defined to include a peripheral section (not shown) and a core section, a portion of which is shown in the figure. The peripheral section of the substrate is masked with a photoresist (not shown), leaving the core portion of the substrate 10 exposed. A first dielectric layer 12 is grown over the core portion of the substrate 10. The first dielectric layer 12 is also known as a tunnel oxide and may be composed of silicon dioxide. A first layer of polysilicon 14 is deposited over the first dielectric layer 12. The first polysilicon layer 14 will eventually be patterned and etched into a plurality of floating gates of the flash memory cells in the memory array.

The method of the present invention continues with the formation of the ONO layer over the first polysilicon layer 14. Referring to FIG. 2, a first oxide layer 16 is grown over the first polysilicon layer 14. The first oxide layer 16 is the bottom layer of the ONO layer, and may be formed at a temperature between approximately 700° C. and 850° C. with a mixture of $SiH_2Cl_2$ and $N_2O$. Because the first oxide layer 16 is grown at a high temperature, it is also known as a high temperature oxide ("HTO").

A layer of nitride 18 is then deposited over the first oxide layer 16. The nitride layer 18 may be deposited with the conventional low-pressure chemical vapor deposition ("LPCVD") process at a temperature of approximately between 600° C. and 750° C. with a mixture of $SiH_2Cl_2$ and $NH_3$. A step of oxygen ion implantation follows to inject oxygen ions ($O_2$) into the nitride layer 18. A nitride layer is generally not very efficient in growing an oxide layer, as would be required to form the ONO layer of a flash memory cell. The implanted oxygen ions will facilitate oxide growth on the nitride layer. The amount of implanted oxygen ions may vary according to applications. In one embodiment, the amount of implanted oxygen ions will increase oxide growth rate of by a thickness of 60 Å. An optional cleaning step may follow after the ion implantation step to clean the surface of the nitride layer 18 damaged by the ion implantation. A hydrogen-fluoride (HF) solution may be used for the cleaning step because nitrides are resistive to HF solutions. The mask in the peripheral section (not shown) is removed.

Referring to FIG. 3, a second oxide layer 22 is grown over the nitride layer 18. The second oxide layer 22 is the top oxide layer of the ONO layer 24. Due to the implanted oxygen ions in the nitride layer 18, the growth rate of the second oxide layer 22 is increased. In one embodiment, the oxide layer 22 is grown by an additional 60 Å over the same period of time as the convention process for growing the top oxide layer. At the same time that the second oxide layer 22 is grown over the nitride layer 18, a gate oxide is grown over the substrate in the peripheral section of the substrate.

A second layer of polysilicon (not shown) is then deposited both in the core and peripheral sections. The second polysilicon layer deposited in the core section will be patterned and etched to form a plurality of control gates of the flash memory cells. The polysilicon layer deposited in the peripheral section will be patterned and etched to form gate structures of the MOS transistors. Conventional manufacturing process steps may then follow to form the source and drain regions of the flash memory cells and MOS transistors.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a semiconductor device, comprising:

defining a substrate to include a peripheral section and a core section;

masking the peripheral section of the substrate;

growing a first dielectric layer over the core section of the substrate;

depositing a first polysilicon layer over the first dielectric layer for forming at least one gate structure;

growing a first oxide layer over the first polysilicon layer;

depositing a nitride layer over the first oxide layer;

implanting oxygen ions into the nitride layer;

unmasking the peripheral section of the substrate; and growing a second oxide layer over the nitride layer, wherein the growth rate of the second oxide layer is increased due to the implantation of oxygen ions in the nitride layer.

2. The method as claimed in claim 1, further comprising a step of cleaning the nitride layer after the step of oxygen ion implantation.

3. The method as claimed in claim 2, wherein hydrogen-fluoride solution is used the cleaning step.

4. The method as claimed in claim 1, wherein the first oxide layer, nitride layer and second oxide layer comprise an oxide-nitride-oxide layer of a transistor.

5. The method as claimed in claim 4, wherein the transistor is a flash memory cell formed in the core section of the substrate.

6. The method as claimed in claim 1, further comprising a step of growing a gate oxide in the peripheral section of the substrate contemporaneously with the step of growing a second oxide layer.

7. The method as claimed in claim 6, wherein the gate oxide is an oxide of a metal-oxide-silicon transistor located in the peripheral section of the substrate.

8. The method as claimed in claim 1, wherein the second oxide layer has an increased growth rate of 60 Å.

9. The method as claimed in claim 1, wherein the step of growing a first oxide layer is performed at a temperature between approximately 700° C. and 850° C.

10. A method for forming a semiconductor device, comprising:

defining a substrate;

growing a first dielectric layer over a core section of the substrate;

depositing a first polysilicon layer over the first dielectric layer for forming at least one gate structure;

growing a first oxide layer over the first polysilicon layer;

depositing a nitride layer over the first oxide layer;

implanting oxygen ions into the nitride layer; and growing a second oxide layer over the nitride layer, wherein the growth rate of the second oxide layer is increased due to the implantation of oxygen ions in the nitride layer.

11. The method as claimed in claim 10, further comprising a step of cleaning the nitride layer after the step of oxygen ion implantation.

12. The method as claimed in claim 11, wherein hydrogen-fluoride solution is used the cleaning step.

13. The method as claimed in claim 10, wherein the first oxide layer, nitride layer and second oxide layer comprise an oxide-nitride-oxide layer of a transistor.

14. The method as claimed in claim 13, wherein the transistor is a flash memory cell formed in the core section of the substrate.

15. The method as claimed in claim 10, wherein the second oxide layer has an increased growth rate of 60 Å.

16. The method as claimed in claim 10, wherein the step of growing a first oxide layer is performed at a temperature between approximately 700° C. and 850° C.

* * * * *